United States Patent
Sharma et al.

(10) Patent No.: US 9,007,244 B2
(45) Date of Patent: Apr. 14, 2015

(54) SAMPLING RATE BASED ADAPTIVE ANALOG BIASING

(71) Applicant: Texas Instruments Incorporated, Dallas, TX (US)

(72) Inventors: Ajit Sharma, Dallas, TX (US); Sriram Narayanan, Richardson, TX (US); Srinath M. Ramaswamy, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/321,434

(22) Filed: Jul. 1, 2014

(65) Prior Publication Data
US 2015/0002324 A1    Jan. 1, 2015

Related U.S. Application Data

(60) Provisional application No. 61/841,776, filed on Jul. 1, 2013.

(51) Int. Cl.
*H03M 1/00* (2006.01)
*H03M 1/12* (2006.01)

(52) U.S. Cl.
CPC .............. *H03M 1/124* (2013.01); *H03M 1/126* (2013.01)

(58) Field of Classification Search
CPC ...... H03M 1/002; H03M 1/124; H03M 1/126
USPC ................................................ 341/122, 155
See application file for complete search history.

(56) References Cited

U.S. PATENT DOCUMENTS

| | | | |
|---|---|---|---|
| 7,242,341 B2 * | 7/2007 | Ariyoshi ....................... | 341/157 |
| 7,750,837 B2 * | 7/2010 | Wang et al. .................. | 341/172 |
| 7,999,714 B2 * | 8/2011 | Pedersen et al. ............. | 341/155 |

OTHER PUBLICATIONS

Refet Firat Yazicioglu et al.; A 30 W Analog Signal Processor ASIC for Portable Biopotential Signal Monitoring; IEEE Journal of Solid-State Circuits, vol. 46, No. 1, Jan. 2011; pp. 209-223.

* cited by examiner

*Primary Examiner* — Khai M Nguyen
(74) *Attorney, Agent, or Firm* — John R. Pessetto; Frank D. Cimino

(57) ABSTRACT

A mixed signal device includes an analog circuit and a digital circuit coupled to the analog circuit. The digital circuit includes a component that samples a signal at a sampling rate that is dynamically variable by the digital circuit based on the bandwidth of the incoming signal. The digital circuit is to automatically assert a signal to the analog circuit to change a bias current of the analog circuit based on a change to the sampling rate in the digital circuit.

14 Claims, 3 Drawing Sheets

SAMPLING RATE BASED ADAPTIVE ANALOG BIASING

CROSS-REFERENCE TO RELATED APPLICATION

This application claims priority to U.S. Provisional App. Ser. No. 61/841,776 filed Jul. 1, 2013, titled "Sampling Rate Based Adaptive Analog Biasing" and incorporated herein by reference.

BACKGROUND

Many types of devices are battery-operated and, as such, have a finite energy source. Some battery-operated devices are mixed signal devices having both an analog circuit and a digital circuit. Emphasis may have been placed on reducing the energy consumption of the digital portion of mixed signal devices, which may or may not be in integrated on the same integrated circuit (IC).

SUMMARY

A mixed signal device includes an analog circuit and a digital circuit coupled to the analog circuit. The digital circuit includes a component that samples a signal at a sampling rate that is dynamically variable by the digital circuit. The digital circuit is to automatically assert a signal to the analog circuit (or parts thereof) to change a bias current of the analog circuit based on a change to the sampling rate in the digital circuit.

Another embodiment is directed to a method for controlling a bias current in a mixed signal device including a digital circuit and an analog circuit. The method includes determining whether a sampling frequency in the digital circuit is to be changed. Further, based on a determination that the sampling frequency is to be changed, the method includes adjusting the sampling frequency in the digital circuit and adjusting a bias current level for the analog circuit based on the adjusted sampling frequency.

BRIEF DESCRIPTION OF THE DRAWINGS

For a detailed description of various examples, reference will now be made to the accompanying drawings in which.

DETAILED DESCRIPTION

Figure 1:
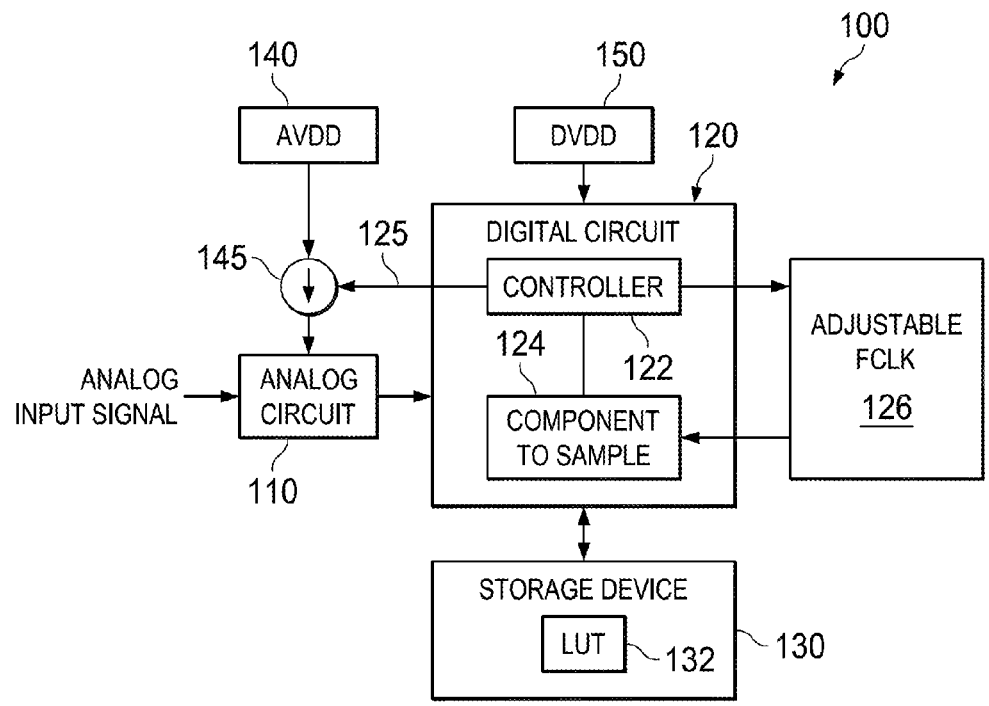
FIG. 1 illustrates a mixed signal device in accordance with the preferred embodiments and including a variable analog bias current based on a digital sampling frequency.

FIG. 1 illustrates an example of a mixed signal device 100 in accordance with a preferred embodiment of the invention. The device 100 is termed a "mixed signal" device because it includes an analog circuit 110 and a digital circuit 120 (i.e., mixed analog and digital). The underlying functionality performed by the analog and digital circuits 110 and 120, and thus of the mixed signal device 100, can be whatever is desired. In one example, the analog circuit 110 includes amplifiers and the digital circuit 120 includes an analog-to-digital converter (ADC) and the mixed signal device 100 functions to receive an analog input signal, amplify the signal, and then digitize the amplified signal for subsequent storage or processing. In one use case, the mixed signal device 100 is used to monitor sensor signals such as temperature readings from a temperature sensor, heart rate signals, etc.

An analog voltage supply (AVDD) 140 is provided to the analog circuit 110 by way of a bias current control 145 in order to power the analog circuit 110. The current control 145 is adjustable to vary the amount of bias current (IBIAS) used by the analog circuit 110. A controller 122 in the digital circuit 120 can assert a control signal to the current control 145 to control the amount of bias current used by the analog circuit.

A digital voltage supply (DVDD) 150 is provided to the digital circuit 120 to power the digital circuit. The digital circuit 120 includes, or otherwise has access to, a storage device 130 which includes a look-up table 132. The digital circuit 120 also includes a component 124 that can sample an analog signal provided by the analog circuit 110. In some implementations, the component 124 is an ADC.

The component has a variable and programmable sampling frequency (also called sampling rate) which is controlled by controller 122. The controller 122 may be implemented as a single controller or multiple controllers working together. The controller 122 may perform an adaptive sample rate algorithm based on the analog input signal to determine a suitable sampling frequency for the component 124 (e.g., ADC). For analog input signals with lower frequency components, the sampling frequency for an ADC can be smaller than for analog input signals with higher frequency components. An adjustable sampling clock (FOLK) 126 is included as part of the digital circuit 120 or is otherwise accessible to the digital circuit and is controlled by the controller 122. For example, if the controller 122 determines that the sampling frequency can be lowered, then the controller causes the adjustable FOLK 126 to lower the sampling frequency of its sampling clock being provided to component 124.

In addition to dynamically adjusting the sampling frequency of component 124, the controller 122 may also cause the bias current for the analog circuit 110 to be adjusted as well. For purposes of this disclosure, the term bias current also encompasses quiescent operating current of the device—i.e., DC current consumed by the analog portion during normal operation. If the sampling frequency is to be decreased, then the controller 122 causes a corresponding decrease in the bias current for the analog circuit. If the sampling frequency is to be increased, then the controller 122 causes a corresponding increase in the bias current for the analog circuit. Any change to the bias current for the analog circuit 110 varies the amount of energy consumed by the analog circuit. As such, by lowering the bias current for the analog circuit 110 based on a change (lowering) of the sampling frequency in the digital circuit 120, the energy consumption of the analog circuit advantageously can be lowered whenever possible based on the sampling frequency of the digital circuit, thereby allowing analog power to scale with incoming signal bandwidth.

In accordance with the preferred embodiments, the look-up table (LUT) 132 stores a plurality of pairs of sampling frequencies and corresponding bias current values. This LUT can be implemented either as part of an on-chip non-volatile memory element or as a stand-alone external memory block. As the controller 122 determines a new value for the sampling frequency for the adjustable FOLK 126, the controller 122 also accesses the LUT 132 to determine the bias current value that has been mapped to the newly determined sampling frequency. The controller 122 then asserts a control signal 125 to the variable current control 145 of the analog circuit to adjust the bias current of the analog circuit 110 to be the bias current value retrieved from LUT 132. The sampling frequency-bias current value pairs stored in LUT 132 preferably are determined apriori through performance testing as explained below.

Figure 2:
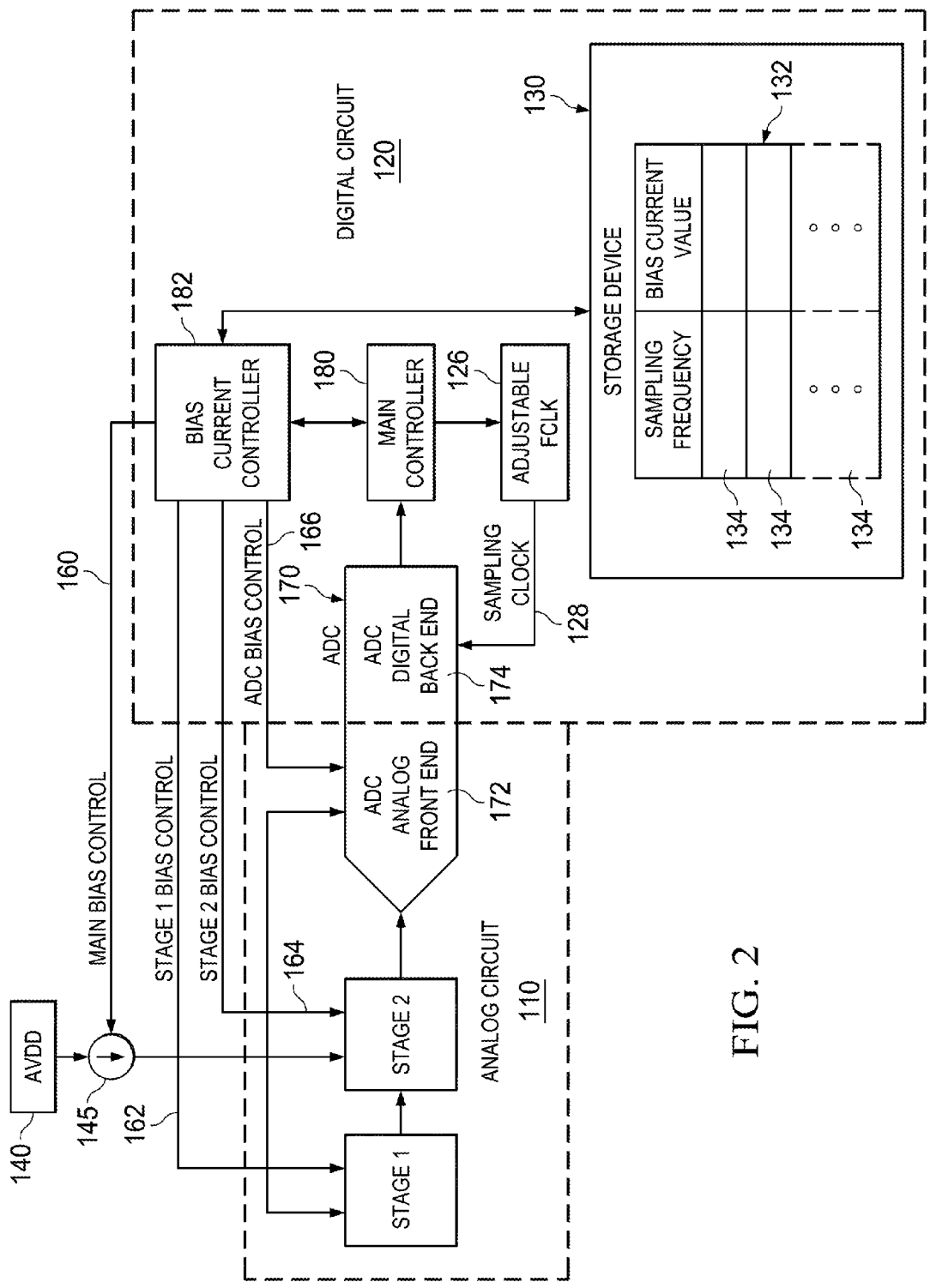
FIG. 2 illustrates another example of a mixed signal device.

FIG. 2 illustrates another embodiment of a mixed signal device. The analog circuit 110 is shown in FIG. 2 to include a plurality of stages—stage 1 and stage 2. Each stage may include an amplifier, filter or other type of analog conditioning circuitry. The amplifier of each such stage may have a low pass frequency response thereby passing and amplifying signals within the bandwidth of the amplifier. The bandwidth of the amplifier, however, is adjustable. For example, the bias current through each stage, at least in part, dictates the bandwidth of that stage. If the bias current for a given stage is lowered, then the bandwidth of that stage also is lowered. Conversely, if the bias current for a given stage is increased, then the bandwidth of that stage also is increased. This means that if the analog input signal changes such that its highest frequency component is reduced, then not only can the sampling frequency in the digital circuit 120 be reduced but so can the bandwidth of the analog circuit stage(s). A lower bandwidth analog stage can be operated at a lower bias current thereby saving energy.

Referring still to FIG. 2, component 124 of FIG. 1 is illustrated as an ADC 170. The ADC 170 includes an ADC analog front-end 172 and an ADC digital back-end 174. The analog front-end 172 may include such elements as a filter, amplifier, and other types of analog conditioning circuits. The ADC digital back-end 174 includes the actual analog-to-digital conversion circuit. The analog front-end 172 may be part of the analog circuit 110 and the ADC back-end 174 may be part of the digital circuit 120.

The controller 122 of FIG. 1 is shown in FIG. 2 as two controllers—a main controller 126 and a bias current controller 182. The main controller 126 may control various digital circuit functions as determining a change to the sampling frequency, storing and processing digitally acquired samples from the ADC 170, etc.

The bias current controller 182 is responsible for causing changes in the bias current of the analog circuit 110 based on changes to the sampling frequency in the digital circuit 120. As such, the bias current controller 182 has access to the LUT 132 of the storage device 130. As shown, the LUT 132 includes a plurality of entries 134. Each entry 134 includes a sampling frequency and a corresponding bias current value as shown. These values are pre-stored in the LUT 132.

The main controller 180 may determine that a change to the sampling frequency should occur (because of a detection of a change in the input analog signal) and causes the adjustable FOLK 126 to change the sampling frequency of the sampling clock 128 to the ADC digital back-end 174. The main controller 180 also sends a signal to the bias current controller 182 indicative of the new sampling frequency. The bias current controller 182 then accesses LUT 132 to obtain the bias current value associated with the newly set sampling frequency. The bias current controller 182 then asserts a main bias control signal 160 to the bias current control 145 to a cause a change to occur to the analog circuit's bias current based on the new sampling frequency.

In some embodiments, the bias current controller 182 only controls the bias current control 145 via a control signal 160 labeled as MAIN BIAS CONTROL in FIG. 2. In other embodiments, the bias current controller 182 has independent control over the bias currents in each of the stages (e.g., stage 1 and stage 2) as well as the analog front-end 172 via control signals 162, 164 and 166 labeled as STAGE 1 BIAS CNTRL, STAGE 2 BIAS CNTRL, and ADC BIAS CNTRL, respectively. In yet other embodiments, and in particular the embodiment of FIG. 2, the bias current controller 182 has independent control over the bias current control 145 as well as the bias currents of each of the stages 1 and 2 and the analog front-end 172.

Figure 3:
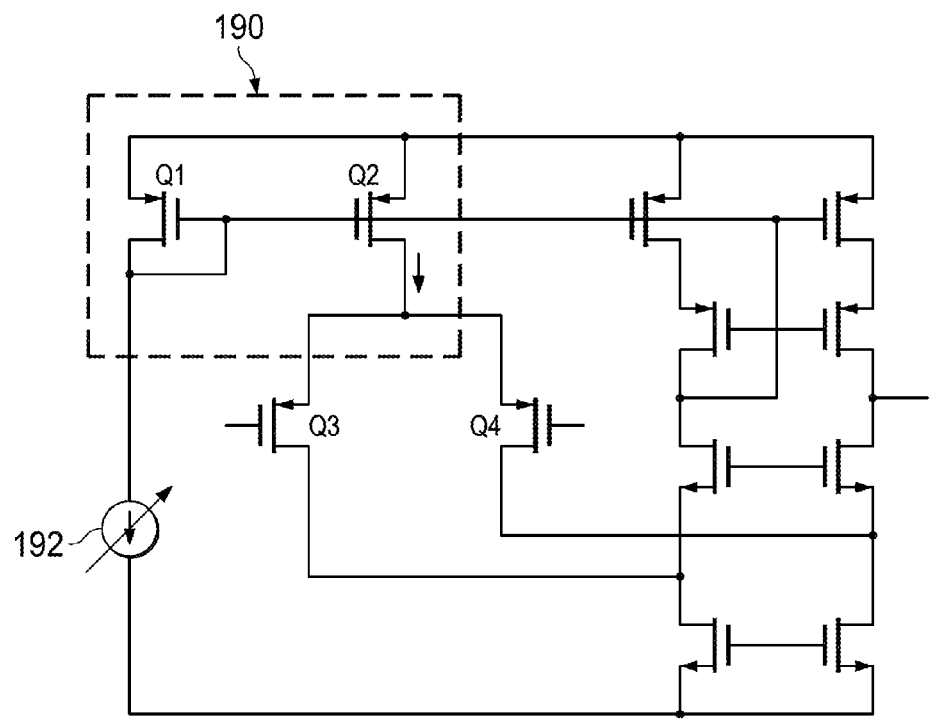
FIG. 3 shows an example of at least a portion of the analog circuit of the mixed signal in accordance with an embodiment for varying its bias current.

FIG. 3 shows an example of at least a portion of each stage (1 and 2) and the ADC analog front-end 12 of the analog circuit 110. The illustrative circuit of FIG. 3 includes a folded cascode amplifier architecture with a current mirror 190. The current mirror 190 includes transistors Q1 and Q2 as shown. A controllable IBIAS element 192 is also shown connected to the drain of Q1. The gate and drain of Q1 are connected together. The drain of Q2 is connected to input transistors Q3 and Q4. The current mirror 190 forces the current through Q2 and thus through the combination of input transistors Q3 and Q4 to be substantially equal to the current through the controllable IBIAS element 192. The controllable IBIAS element 192 may comprise a digitally controllable current mirror or an analog programmable current source comprising floating-gate controlled devices and may be controlled by the appropriate control signal from, for example, the bias current controller 182.

Figure 4:
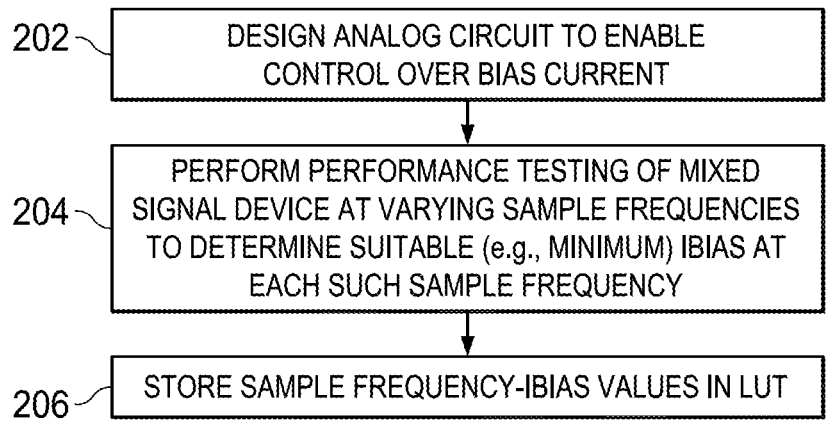
FIG. 4 shows a method for determining suitable bias currents to use for various sampling frequencies in accordance with various embodiments.

FIG. 4 illustrates a method in accordance with various embodiments. At 202, the method includes designing the analog circuit of a mixed signal device so as to enable an external control over the bias current of the analog circuit. FIG. 3 provides one such circuit mechanism to enable an external control signal to control the bias current of an analog circuit. Again, the digital control signal can either control the total DC bias current through the entire analog portion of the circuit or individual legs of a core amplifier.

At 204, the method includes performing performance testing of the mixed signal device at a varying sample frequencies to determine a suitable IBIAS current at each such sample frequency. The suitable bias current may be, for example, a minimum DC bias current that still produces acceptable analog circuit performance (e.g., acceptable bandwidth for the chosen bandwidth). The suitable IBIAS current may be an overall bias current for the entire analog circuit, the individual bias currents through each stage and ADC analog front-end of, or both the overall and individual stage/ADC front-end bias currents.

At 206, the sample frequency and bias current value pairs are stored in the LUT 132 of the storage device 130. Any number of sample frequency/bias current value pairs may be stored in the LUT 132, but preferably at least pairs for the sample frequencies that the mixed signal device is expected to encounter while in operation. This evaluation and storage can be performed either a-priori to actual usage during production testing or in a calibration phase in field.

Figure 5:
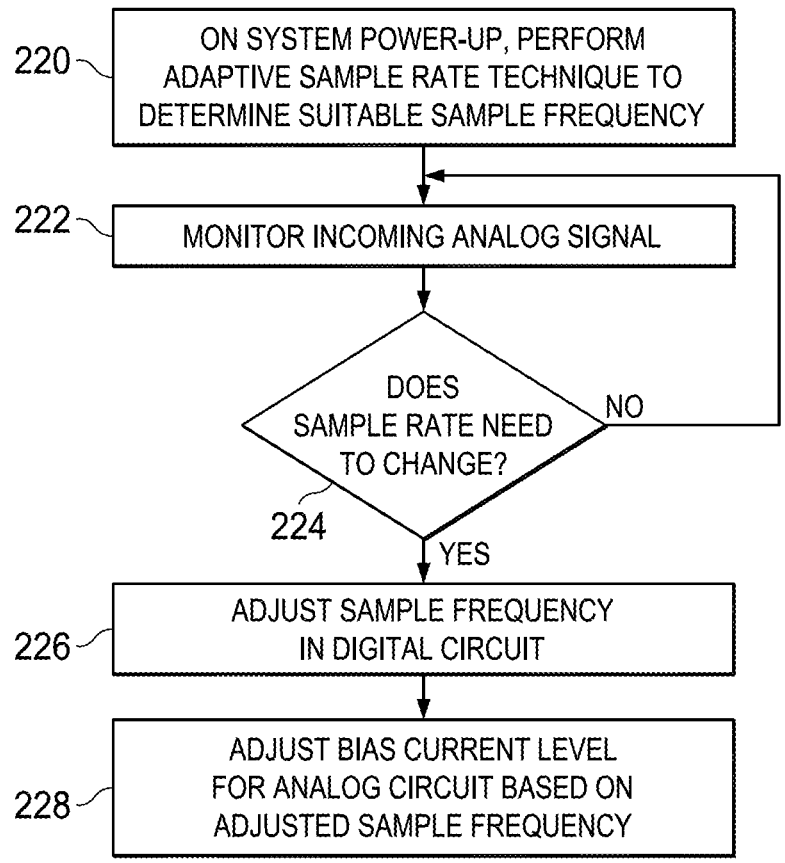
FIG. 5 shows a method performed by the mixed signal device of FIGS. 1 and 2 in accordance with various embodiments.

FIG. 5 illustrates a method implemented by a mixed signal device such as device 100. The device preferably already has the LUT 132 updated with the sample frequency/bias current value data as described above. At 220, the method includes performing an adaptive sample rate technique (e.g., by main controller 180) to determine a suitable sample frequency. This operation may be performed during device power-up and/or during normal device operation after power-up. Any suitable adaptive sample rate technique may be used such as that described in Yazicioglu et. al., "A 30 µW Analog Signal Processor ASIC for Portable Biopotential Signal Monitoring," IEEE Journal of Solid-State Circuits, vol. 46, No. 1, January 2011, incorporated herein by reference.

At 222, the method includes monitoring an incoming analog signal by, for example, main controller 180. The main controller determines whether the sample frequency for the ADC 170 should be changed based on assessment of the frequency content of the received input signal (e.g., by performing the adaptive sample rate technique noted above). If the frequency content of the input signal remains the same as it was previously, then the sampling frequency is not altered and control loops back to operation 222.

If, however, the main controller 180 determines that the sampling frequency should change (either to be increased if the frequency content of the input signal has increased or to be decreased if the frequency content of the input signal has decreased), then at 226, the method includes adjusting the sample frequency in the digital circuit 120. The main controller 180 may be used to adjust the sample frequency as explained above.

At 228, the method includes adjusting the bias current level for the analog circuit 110 based on the adjusted sample frequency. This operation may be performed by the bias current controller 182 receiving an indication from the main controller 180 of the new sample frequency and accessing the LUT 132 to obtain the bias current value that is associated with the new sample frequency. In some embodiments, the bias current controller 182 may interpolate between two bias current levels if the particular sample rate is not found in LUT 132. The bias current controller 182 then controls the bias current control 145 and/or the bias current levels of each separate stage of the analog circuit to so that the bias current of the analog circuit is commensurate with (e.g., matches) the bias current level obtained from LUT 132 that maps to the new digital circuit sample frequency. Control then loops back to operation 222 at which the process repeats.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A mixed signal device, comprising:
   an analog circuit; and
   a digital circuit coupled to the analog circuit, wherein the digital circuit includes a component that samples a signal at a sampling rate that is dynamically variable by the digital circuit;
   wherein the digital circuit is to automatically assert a signal to the analog circuit to change a bias current of the analog circuit based on a change to the sampling rate in the digital circuit.

2. The mixed signal device of claim 1 wherein the component includes an analog-to-digital converter.

3. The mixed signal device of claim 1 further including storage accessible to the digital circuit and configured to include a look-up table which includes a plurality of sampling frequencies, each such sampling frequency mapped to a different bias current value.

4. The mixed signal device of claim 3 wherein the digital circuit determines a sampling frequency to use for the digital circuit and determines a corresponding bias current value from the look-up table.

5. The mixed signal device of claim 3 wherein the digital circuit includes a controller configured to:
   perform an adaptive sample rate algorithm based on an analog input signal to determine a sampling rate;
   access the look-up table to determine the bias current value mapped to the determined sampling rate; and
   assert a control signal to a bias current control in the analog circuit to control the bias current of the analog circuit based on the determined bias current value.

6. The mixed signal device of claim 1 wherein the analog circuit includes a plurality of analog stages, each stage having a controllable stage bias current and wherein the digital circuit asserts control signals to each of the analog stages to independently control the bias current of each such stage based on the change to the sampling rate in the digital circuit.

7. The mixed signal device of claim 1 wherein the analog circuit includes a bias current control coupled to a plurality of analog stages, each stage having a controllable stage bias current and wherein the digital circuit asserts control signals to the bias current control and to each of the analog stages to independently control the bias current of the bias current control and the bias current of each such stage based on the change to the sampling rate in the digital circuit.

8. The mixed signal device of claim 1 wherein the digital circuit is configured to dynamically cause the bias current of the analog circuit to change during operation.

9. A method for controlling a bias current in a mixed signal device including a digital circuit and an analog circuit, comprising:
   determining whether a sampling frequency in the digital circuit is to be changed; and
   based on a determination that the sampling frequency is to be changed, adjusting the sampling frequency in the digital circuit and adjusting a bias current level for the analog circuit based on the adjusted sampling frequency.

10. The method of claim 9 wherein the analog circuit includes a plurality of analog stages and wherein the method further comprises independently adjusting bias current levels of each stage based on the adjusted sampling frequency.

11. The method of claim 9 wherein the analog circuit includes a plurality of analog stages and wherein the method further comprises, based on the adjusted sampling frequency, independently adjusting an overall bias current level of the analog circuit and bias current levels of each stage.

12. A mixed signal device, comprising:
   an analog circuit includes an analog front-end of an analog-to-digital converter (ADC) and a bias current control;
   a digital circuit coupled to the analog circuit, wherein the digital circuit includes a digital back-end of the ADC that samples an analog input signal at a sampling rate that is dynamically variable by the digital circuit;
   storage accessible to the digital circuit and configured to include a look-up table which includes a plurality of sampling frequencies, each such sampling frequency mapped to a different bias current value; and
   a controller coupled to the analog and digital circuits, wherein the controller is configured to:
      perform an adaptive sample rate algorithm based on an analog input signal to determine a sampling rate for the ADC;
      access the look-up table to determine the bias current value mapped to the determined sampling rate; and
      assert a control signal to the bias current control to control the bias current of the analog circuit based on the determined bias current value.

13. The mixed signal device of claim 12 wherein the controller is configured to dynamically cause the bias current of the analog circuit to change during operation.

14. The mixed signal device of claim 12 wherein the analog circuit includes a plurality of analog stages, each stage having a controllable stage bias current and wherein the control asserts control signals to the bias current control and to each of the analog stages to independently control the bias current of the bias current control and the bias current of each such stage based on the change to the sampling rate in the digital circuit.

* * * * *